United States Patent
Akiyama et al.

[11] Patent Number: 6,148,763
[45] Date of Patent: Nov. 21, 2000

[54] DEPOSITED FILM FORMING APPARATUS

[75] Inventors: Kazuyoshi Akiyama; Toshiyasu Shirasuna; Kazuhiko Takada, all of Nara; Ryuji Okamura; Hitoshi Murayama, both of Kyoto, all of Japan

[73] Assignee: Canon Kabushiki Kaisha, Tokyo, Japan

[21] Appl. No.: 09/182,002

[22] Filed: Oct. 29, 1998

[30] Foreign Application Priority Data

Oct. 31, 1997 [JP] Japan ................................. 9-316424

[51] Int. Cl.⁷ .................................................. C23C 16/00
[52] U.S. Cl. ..................... 118/723 E; 118/715; 118/732
[58] Field of Search ....................... 118/723 E, 723 MW, 118/719, 723 IR, 732, 715, 716

[56] References Cited

U.S. PATENT DOCUMENTS

| 4,633,812 | 1/1987 | Fujiyama | 118/723 E |
| 4,951,602 | 8/1990 | Kanai | 118/719 |
| 5,192,370 | 3/1993 | Oda et al. | 118/723 MV |
| 5,360,484 | 11/1994 | Takai et al. | |

FOREIGN PATENT DOCUMENTS

| 54-086341 | 7/1979 | Japan. |
| 4-247877 | 9/1992 | Japan. |

*Primary Examiner*—Gregory Mills
*Assistant Examiner*—Parviz Hassanzadeh
*Attorney, Agent, or Firm*—Fitzpatrick, Cella, Harper & Scinto

[57] ABSTRACT

In a deposited film forming apparatus, at least part of the inner wall surfaces of a reactor or surfaces of structural component parts on which films are deposited is constituted of a porous ceramic material. This can prevent film come-off of deposited films on inner walls and structural component parts of the reactor as far as possible so that the spherical protuberances can be prevented from occurring and electrophotographic photosensitive members having a superior quality can be formed.

10 Claims, 4 Drawing Sheets

DEPOSITED FILM FORMING APPARATUS

BACKGROUND OF THE INVENTION

1. Field of the Invention

This invention relates to an apparatus, and a process, for forming deposited films. More particularly, it relates to a deposited film forming apparatus and a deposited film forming process which are preferably used for producing amorphous silicon type electrophotographic photosensitive members by plasma enhanced CVD.

2. Related Background Art

In the field of image formation, photoconductive materials capable of forming light-receiving layers in light-receiving members such as photosensitive members are required to have properties such that they are highly sensitive, have a high SN ratio [light current (Ip)/dark current (Id)], have absorption spectra suited to spectral characteristics of electromagnetic waves to be radiated, have a high response to light, have the desired dark resistance and are harmless to human bodies when used. In particular, in the case of electrophotographic light-receiving members set in electrophotographic apparatus use as office machines in offices, the above harmlessness in their used is an important point.

Electrophotographic light-receiving members are available which make use of amorphous silicon (a—Si) as materials that can meet such a demand. For example, Japanese Patent Application Laid-open No. 54-86341 discloses a technique relating to an electrophotographic light-receiving member having superior moisture resistance, durability and electrical properties which makes use of a—Si in a photoconductive layer. Such a technique has brought into practical use electrophotographic light-receiving members constituted of a—Si which have been improved in electrical, optical and photoconductive properties, service environmental properties and durability and also can be improved in image quality level.

Meanwhile, the production of a—Si electrophotographic light-receiving members requires a high-level technique. Especially in the case of the electrophotographic light-receiving members, a larger area and a larger layer thickness are required, compared with other devices, and hence, it is an important factor how uniformity is ensured over the whole area and how abnormal growth of films be prevented which may occur around foreign matter during the deposition of a—Si films.

From such viewpoints, a variety of proposals have been made also on how industrially stably high-quality a—Si electrophotographic light-receiving members be manufactured. In particular, in the electrophotographic light-receiving members, what is greatly questioned is the occurrence of spherical protuberances that may cause what is called "white dots", which are fine white dots appearing on copied images. The cause of such spherical protuberances is known to be dust and also fragments caused when any films having adhered to the interior (e.g., inner walls, and surfaces of structural component parts) of a deposited film forming apparatus come off, which may adhere to a substrate or a deposited film being formed on the substrate and may serve as nuclei around which the deposited film on the substrate causes abnormal growth. As a technique for preventing such spherical protuberances from occurring, various improvements are attempted on appratus. For example, it is known that, as a material for improving adhesive properties of films adhering to inner walls and surfaces of structural component parts of a reactor and for preventing such films from coming off, a ceramic material whose surface roughness has been controlled is used in the interior of a reactor so that the films can be made to come off much less frequently from such portions. As an example of such a technique, Japanese Patent Application Laid-open No. 4-247877 discloses a technique in which the vicinity of a gas release hole is formed of a ceramic so that films can be prevented from coming off to restrain the spherical protuberances from occurring.

However, in recent years, electrophotographic apparatus are sought to be made higher in image quality, higher in speed and higher in durability than ever. In addition, for the purpose of maintenance-service cost reduction, individual component parts are required to be improved in reliability so that the maintenance may be made at longer intervals, and electrophotographic light-receiving members have become durable against repeated use for a much longer time than ever in various environments without maintenance by servicemen. Under such circumstances, conventional electrophotographic light-receiving members have room for improvement.

As matters stand like this, it has become known that even spherical protuberances which are so fine that any white dots can not be recognized on images may cause various problems. Especially when the electrophotographic process is made high-speed and toners are made to have a smaller particle diameter in order to make image quality higher, melt-adhesion may come into great question, in which any unnecessary toner having remained on the surface of a photosensitive member melts and adheres thereto during electrophotographic processing such as cleaning. It has been found that this melt-adhesion is caused by the fine spherical protuberances, which act as a beginning to which toner adheres, and come to grow gradually with repetition of image formation. Even when no melt-adhesion occurs, the fine spherical protuberances may come off during the repetition of image formation over a long period of time. In this case, it has become known that the ability of charge retention of electrophotographic photosensitive members may be damaged even if the spherical protuberances are small, and hence the potential may become low to an extent about two to 10 times the diameter of each actual spherical protuberance to cause white dots appearing on images.

In the meantime, to prevent such fine spherical protuberances, the technique which employs a ceramic material having a controlled surface roughness as stated previously may have, in the present situation, problems on electrophotographic photosensitive member production processes.

The above Japanese Patent Application Laid-open No. 4-247877 discloses that ten-point average roughness (Rz) of the surface of a ceramic may be controlled within the range of from 5 $\mu$m to 200 $\mu$m to prevent films effectively from coming off. Thus, the use of a ceramic material in the interior of a reactor is effective for preventing films from coming off (film come-off).

Use of the ceramic having a surface roughened as stated above can bring about an effect attributable to a good adhesion to a—Si deposited films that is inherent in ceramics and attributable to the relaxation of film stress per unit area due to an enlarged surface area.

When the surface roughness of ceramic materials is controlled, a method most commonly used is blast finishing carried out by blowing a blasting medium against the surface. However, sintered ceramics, in particular, alumina ceramics, which are considered suitable especially for preventing film come-off, commonly have so high a hardness that it is actually not easy to finish the surface uniformly at a desired value of surface roughness by blast finishing. Especially in the case of a ceramic material having a cylindrical form, it is difficult, because of its form, to blow the blast medium uniformly. In actual surface roughness, non-uniform roughness may be seen at some portions.

In instances where some portions differ in surface roughness, fine film come-off may occur in some cases in the vicinity of boundaries of areas having extremely different surface roughness, and have caused fine spherical protuberances in some cases. In order to prevent the non-uniform surface roughness, the surface roughness at each point of component parts of a reactor must be measured and thereafter the surface must be again put to blast finishing, which is done repeatedly. This, however, is not preferable in view of cost management.

It has also become clear that, even in component parts whose surfaces have been roughened uniformly by careful blast finishing, the adhesion of deposited films formed thereon may become gradually poor during the use over a long period of time. This is caused by the surface coming to be scraped because of a mechanical stress applied to ceramic component parts, e.g., their rubbing against other component parts. To avoid such a problem, the component parts are obliged to be put to periodical blast finishing to reprocess the surface. In such an instance, too, the management of surface roughness is necessary and complicated operations are required as stated previously.

In addition, depending on the shape of a component part in the reactor constituted of ceramic materials, blast finishing may be difficult at some portions even though deposited films may adhere thereto. As the result, the film come-off can not be effectively prevented in some cases.

According to experiences the present inventors have had, even when the film come-off occurs inside the reactor in the course of deposited film formation because of the use of such component parts, it occurs on a very small scale. Accordingly, the spherical protuberances appearing on the electrophotographic photosensitive member are so fine that it can be a rare case that spherical protuberances that may cause white dots on copied images come to appear on the surface of the electrophotographic photosensitive member. Under existing circumstances, however, because of the much higher demand on electrophotographic apparatus than ever in recent years as stated previously, a countermeasure is desired also against such fine spherical protuberances that may not cause white dots.

SUMMARY OF THE INVENTION

An object of the present invention is to solve the above problems to provide a deposited film forming apparatus and a deposited film forming process that can prevent film come-off of deposited films on inner walls and structural component parts of the reactor as far as possible so that the spherical protuberances can be prevented from occurring and electrophotographic photosensitive members having a superior quality can be formed.

To achieve the above object, the present invention provides a deposited film forming apparatus comprising a means for introducing at least high-frequency power to the inside of a reactor, a means for feeding a material gas into the reactor, and a substrate supporting means for supporting a substrate on which a deposited film is to be formed;

the deposited film being formed on the substrate by applying the high-frequency power thereon to cause glow discharge to take place to decompose the material gas;

wherein;
at least part of the inner wall surfaces of the reactor or surfaces of structural component parts on which films are deposited is constituted of a porous ceramic material.

In the deposited film forming apparatus of the present invention, the porous ceramic material may have an average pore diameter of from 1 μm to 150 μm, and preferably from 2 μm to 100 μm, and an apparent porosity of from 10% to 39%, and preferably from 20% to 35%.

In the deposited film forming apparatus of the present invention, the porous ceramic material may comprise an alumina ceramic.

In the deposited film forming apparatus of the present invention, the porous ceramic material may alternatively comprise boron nitride.

In the deposited film forming apparatus of the present invention, the porous ceramic material may still alternatively comprise titanium dioxide.

The present invention also provides a deposited film forming process comprising the steps of feeding a material gas to the inside of a reactor, and applying high-frequency power to cause glow discharge to take place to decompose the material gas, to thereby form a deposited film on a substrate provided in the reactor, wherein;

at least part of the inner wall surfaces of the reactor or surfaces of structural component parts on which films are deposited is constituted of a porous ceramic material, and the deposited film is formed on the substrate while forming a deposited film on that part.

In the deposited film forming process of the present invention, the porous ceramic material may have pores having an average diameter of from 1 μm to 150 μm, and preferably from 2 μm to 100 μm, and an apparent porosity of from 10% to 39%, and preferably from 20% to 35%.

The present invention, constituted as described above, makes it possible to maintain component parts having a uniform and good surface roughness without relying on any mechanical surface-roughening means such as blast finishing as conventionally employed and hence without being influenced by the shapes of component parts, and concurrently to attain a good surface roughness over a long period time without requiring any reprocessing to roughen the surfaces periodically. In addition, since a ceramic material is used as a porous material, it can be used widely in the reactor while utilizing its properties such as heat resistance and corrosion resistance.

DESCRIPTION OF THE PREFERRED EMBODIMENTS

The deposited film forming apparatus of the present invention has a reactor at least part of the inner wall surfaces and component part surfaces of which is constituted of a porous ceramic material.

The porous ceramic material used in the present invention refers to a ceramic in which pores are distributed substantially uniformly and these stand interconnected three-dimensionally to have permeability. This property is important in order to attain uniform surface properties on every surface of the ceramic material.

In the present invention, the surface portion of a ceramic has pores. Hence, the surface area can be made larger and besides a deposited film formed thereon goes around into the pores at the surface-most portion in the course of its growth. In addition, as the deposited film becomes bulky on the pore surfaces, it comes to play a role as an anchor to bring about the effect of strengthening the adhesion of the deposited film to the ceramic.

According to experiments made by the present inventors, the inner-wall deposited film did not go around into pores when the pores well had an average diameter smaller than 1 $\mu$m, and hence no clear difference was seen in the effect of preventing the spherical protuberances on the electrophotographic photosensitive member, compared with a deposited film forming apparatus making use of a ceramic material having no pores.

On the other hand, when the pores had an average diameter larger than 150 $\mu$m, no film was formed on the porous ceramic material depending on conditions. Instead, powdery matter was formed, and there was conversely a tendency of increase in spherical protuberances. This is presumably because, when the pores are large, films become deposited thickly in islands before a continuous film is formed through the insides of pores and the surface of the ceramic, so that part of the film can not withstand a stress to cause fine film come-off. Thus, the present invention can be especially effective when a deposited film is formed which stands continuous so as to interconnect the individual pores at the surface portion of the porous ceramic material.

When an apparent porosity was lower than 10%, the distribution of pores was so thin that no clear difference was also seen compared with the deposited film forming apparatus making use of a ceramic material having no pores, because of less effectiveness in the role as an anchor stated above.

On the other hand, when an apparent porosity was higher than 39%, the ceramic material tended to show an abrupt decrease in mechanical strength, and was not durable to a stress of the deposited film in some cases, resulting in come-off of the ceramic material itself.

Figure 1:
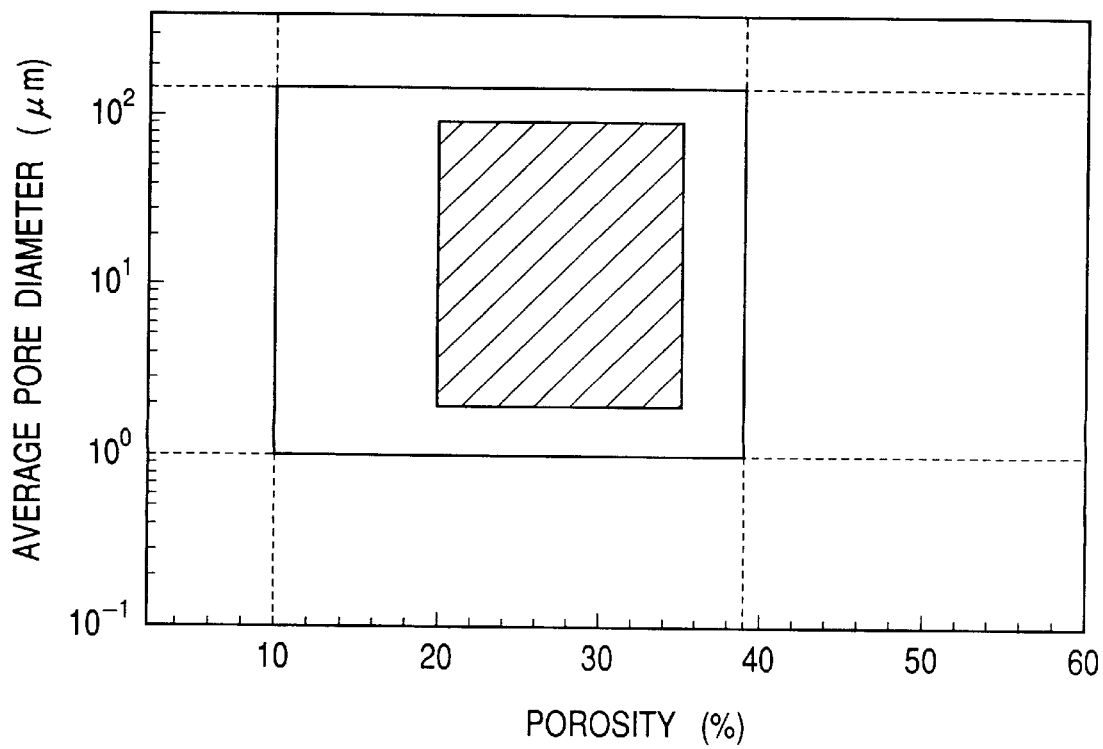
FIG. 1 is a graph showing an example of the relationship between average pore diameter and porosity of a porous ceramic material.

Thus, the porous ceramic material may preferably have an average pore diameter of from 1 $\mu$m to 150 $\mu$m and an apparent porosity of from 10% to 39%. When the apparent porosity is plotted as abscissa and the average pore diameter as ordinate, those within the region surrounded by solid lines in FIG. 1 are preferably usable. Also, those within the region shaded in FIG. 1 are most preferred, where the material has an average pore diameter of from 2 $\mu$m to 100 $\mu$m and an apparent porosity of from 20% to 35%.

Figure 2:
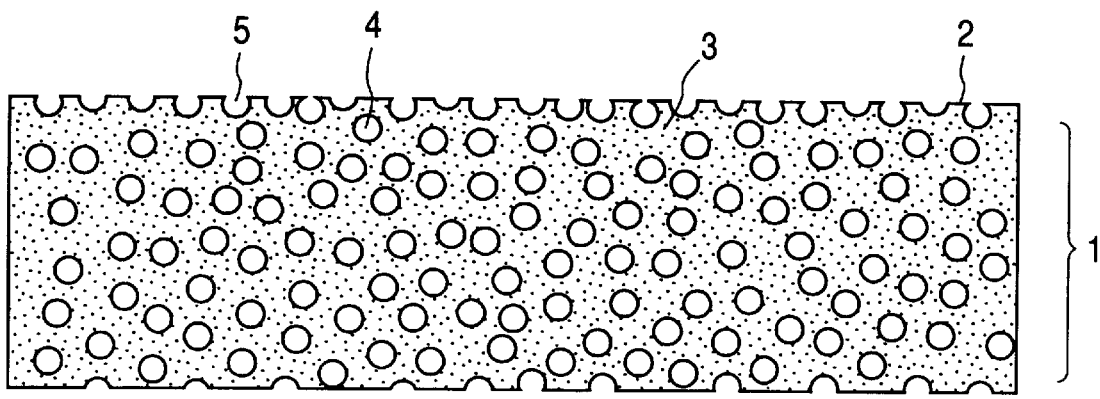
FIGS. 2 and 3 are each a diagrammatic cross section illustrating an example of the porous ceramic material.
Figure 3:
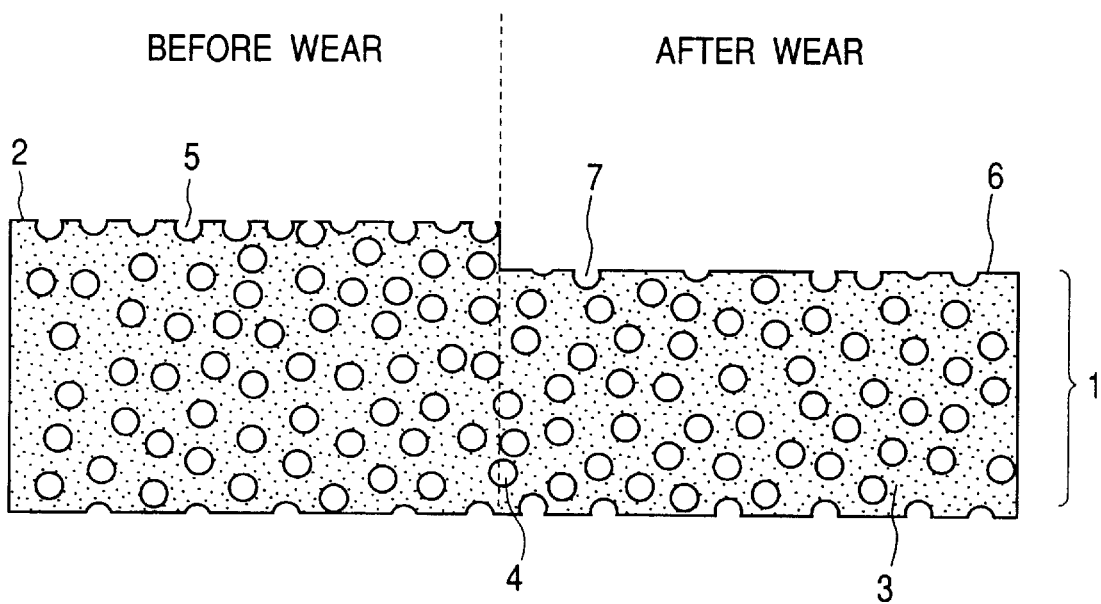

FIGS. 2 and 3 are each a diagrammatic cross section illustrating an example of the porous ceramic material used in the present invention. The porous ceramic material 1 has a structure wherein pores 4 are distributed uniformly in ceramic 3. Pores stand interconnected three-dimensionally in themselves. In FIGS. 2 and 3, however, they are expressed for simplification as if spherical pores are distributed uniformly. Pores 5 are laid bare to the surface 2 of the porous ceramic material. The surface roughness substantially depends on the average diameter and apparent porosity of the pores 5. Accordingly, it is unnecessary for the surface to be roughened by mechanical processing such as blast finishing as in the case of ceramic materials having no pores. Also, since the pores are distributed uniformly, a surface roughness that is uniform over the whole member can be attained.

FIG. 3 illustrates diagrammatically a cross section of the porous ceramic material used in the present invention, for especially depicting how its surface has worn as a result of its use for a long period of time.

The left in the drawing shows a state before wear, and the right in the drawing a state after wear. As shown in FIG. 3, a surface 2 before wear has worn to a surface 6 after wear. However, since pores 6 become laid bare anew also on the surface 6 after wear, the surface roughness is by no means damaged. In this case, too, the pores are distributed uniformly in the whole volume, and hence the surface roughness is ensured as uniformly as that before wear.

On the other hand, in the case of ceramic materials having no pores, even though a good surface state is maintained before wear, the surface becomes smooth (comes to have a small Rz) after wear as will be shown later by experiment. Once the surface has become smooth, a good surface roughness is not restored unless the processing such as blast finishing is again carried out.

In the present invention, pores distributed uniformly in the materials themselves stand laid bare to the surfaces at their every area whatever shapes component parts may have. Hence, even when the component parts have such shapes that may make it difficult to carry out surface roughening such as blast finishing, the present invention makes it possible to effectively prevent deposited films from coming off the surfaces of such component parts. A good surface roughness can be attained over the whole surfaces of the component parts.

As described above, in the present invention, the porous ceramic material is used in the interior of the reactor, thus a surface roughness that is uniform and is good for preventing deposited films from coming off can be attained without being influenced by the shape of the interior of the reactor, the frequency of use of component parts and any uneven surface roughening in the blast finishing or the like. This enables effective prevention of film come-off in the interior of the reactor, so that the fine spherical protuberances can be effectively prevented from occurring on the surface of the electrophotographic photosensitive member.

In the present invention, so to speak, the problems in the prior art are solved by employing, in a deposited film forming apparatus, the porous ceramic material in the interior of the apparatus at its part other than the substrate on which deposited films are to be formed and/or in the surface portion of a structure provided in the interior, at least at its part on which unwanted deposited films are formed.

Examples of embodiments of the present invention will be described below in detail.

As stated previously, the surface roughness substantially depends on the average pore diameter and apparent porosity the porous ceramic material has. Of course, the surface roughness may also depend greatly on mechanical processing carried out when the porous ceramic material is formed. However, taking account of the adhesion of deposited films after the wear of the surface as a result of use for a long period of the time as stated previously, the surface roughness attributable to such mechanical processing is not significant and the surface roughness depending on the average pore diameter and apparent porosity is important. The surface roughness in this instance can not be defined sweepingly because it may more or less differ depending also on, e.g., the shape and make-up of pores or the conditions for producing the porous ceramic material. Those having average pore diameter and porosity within the optimum range shown in FIG. 1 have a surface roughness within the range of from 15 μm to 120 μm as a ten-point mean roughness (Rz), which is prescribed in JIS B 0601, measured on a standard length of 2.5 mm. These numerals come within a range preferable for preventing the deposited films from coming off.

In the present invention, as materials used to form the porous ceramic material, any materials may be used so long as they can form the uniform pores satisfying the optimum range of the average pore diameter and porosity as shown in FIG. 1. For example, alumina ceramics, silicon nitride, boron nitride, silicon carbide, zirconia, aluminum nitride, cordierite, titanium dioxide and mixtures of any of these may be used. In view of a high adhesion to deposited films, alumina ceramics, boron nitride and titanium dioxide are preferred. When absorption of high-frequency power is further questioned, alumina ceramics and boron nitride are most preferred.

Figure 4A:
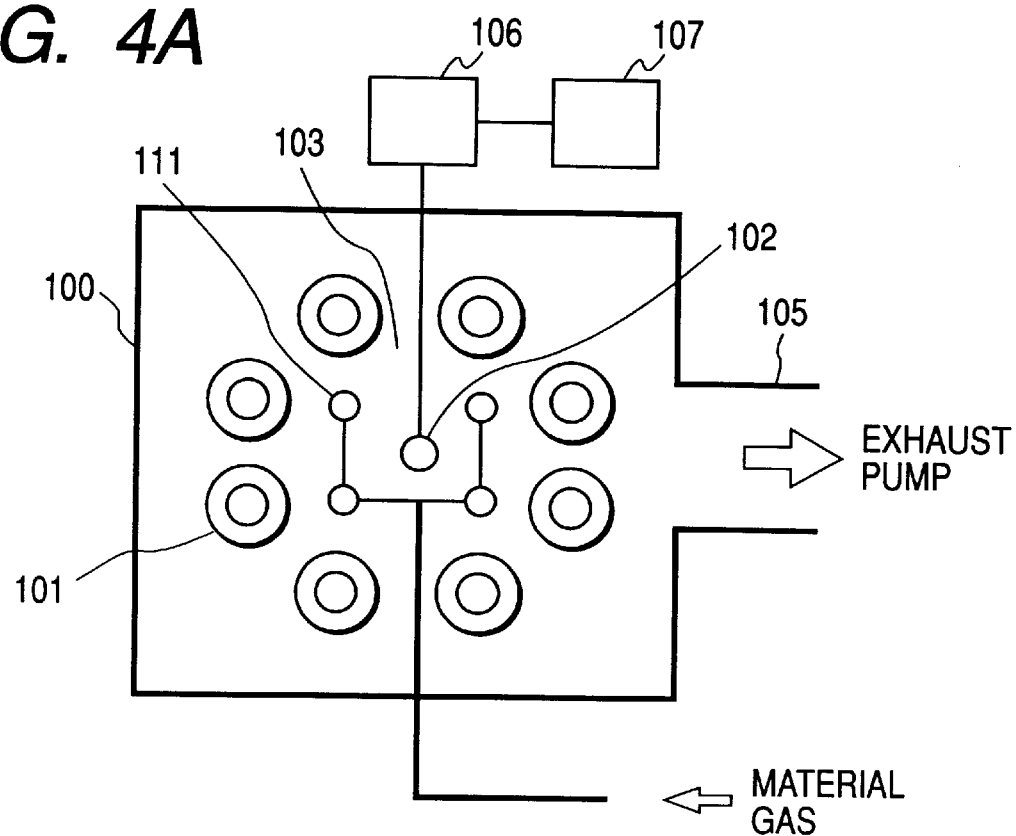
FIGS. 4A and 4B are diagrammatic cross sections illustrating an example of a deposited film forming apparatus.
Figure 4B:
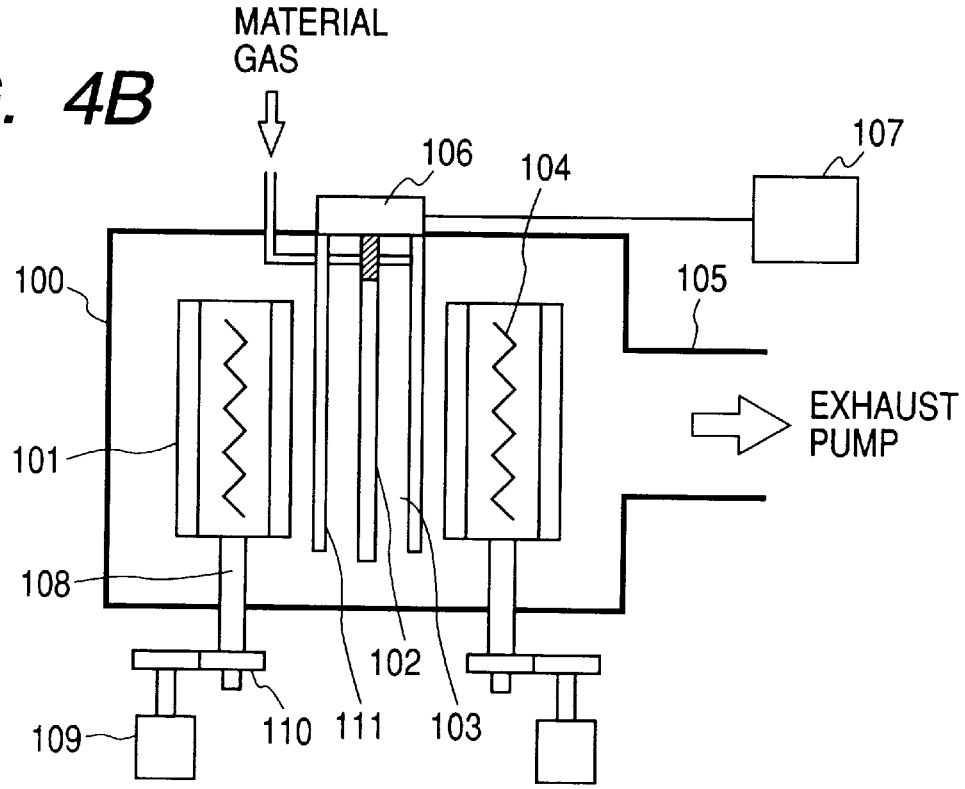

FIGS. 4A and 4B are diagrammatic illustrations of an example of a deposited film forming apparatus usable in the present invention. FIGS. 4A and 4B are diagrammatic views of an instance where a plurality of cylindrical conductive substrates are so made up as to be disposed on the same circumference. FIG. 4A is a transverse cross section, and FIG. 4B a vertical cross section.

This production apparatus is constituted chiefly of a reactor 100, a material gas feed system (not shown), an exhaust system (not shown) for evacuating the inside of the reactor 100 and a power source 107 for supplying electric power to a high-frequency electrode 102. In the reactor 100, cylindrical and conductive substrates 101, substrate heaters 104 and an electrode 102 for introducing the high-frequency power into the reactor are provided. To the electrode 102, the high-frequency power source 107 is connected via a high-frequency matching box 106. The substrates 101 are held on rotating shafts 108 via holders (not shown). The rotating shafts 108 pass through the reactor 100 to its atmosphere side via vacuum seals (not shown), and are connected to motors 109 via gears 110. In a glow discharge region 103, a material gas feed means 111 is provided and is connected to the material gas feed system (not shown).

When the present invention is carried out using the apparatus shown in FIGS. 4A and 4B, the porous ceramic material may be used in any desired component parts at their areas where the porous ceramic material can be used without difficulty in view of material characteristics. For example, it may be used in deposition shielding plates for preventing deposited films from adhering directly to the inner wall surface of the reactor, electrode covers provided at electrodes for the like purpose, and dummy substrates set above and below the substrates 101 in order to support the substrates (all not shown).

Figure 5:
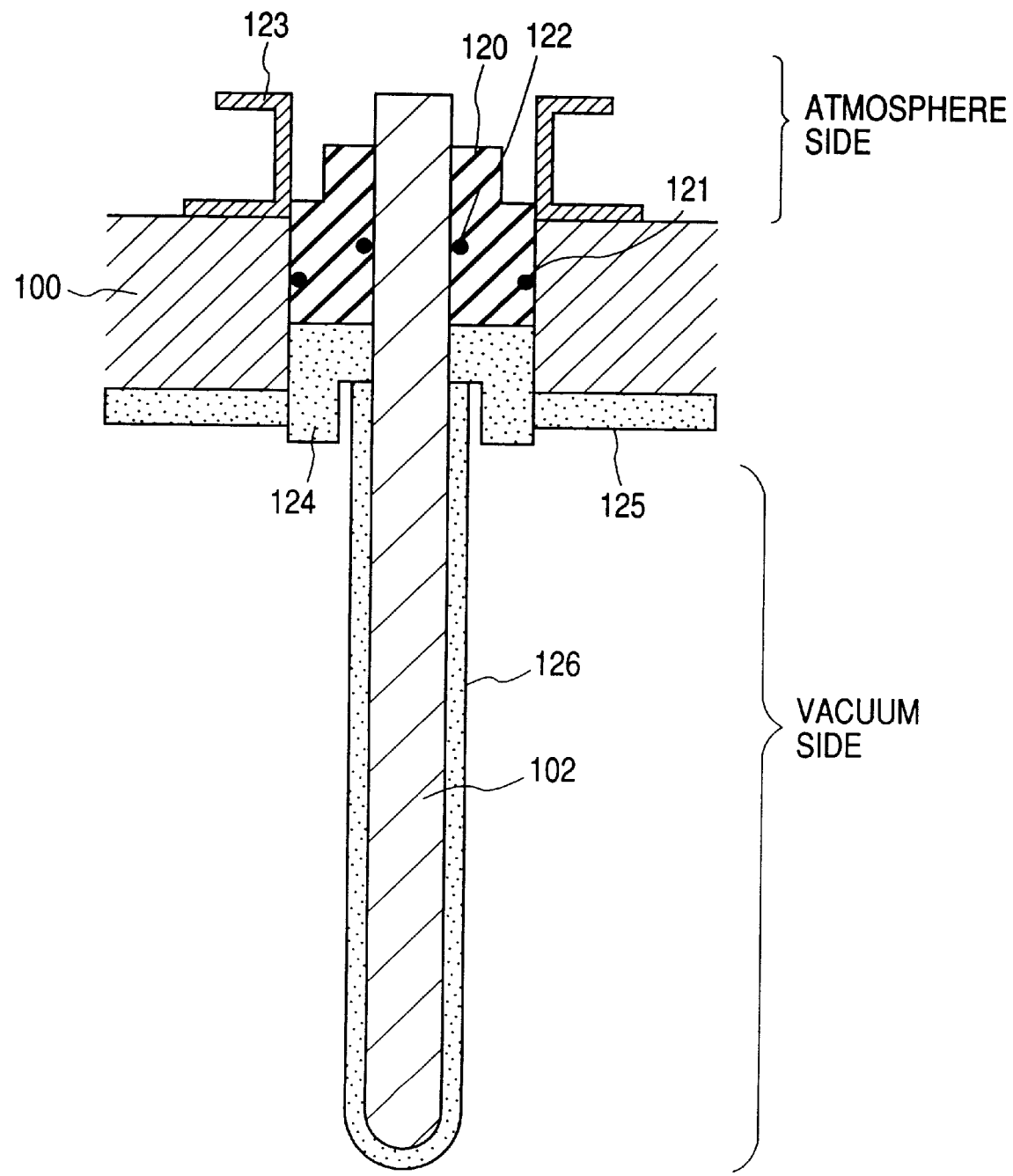
FIG. 5 is a diagrammatic cross section illustrating an example of the constitution of a high-frequency power feed means and its vicinity.

FIG. 5 is a diagrammatic cross section illustrating an example of a high-frequency power feed means in the case where the porous ceramic material in the present invention is used. In the example shown in FIG. 5, the electrode 102 is so provided in the reactor 100 as to pass through its wall. The electrode 102 is electrically insulated from the reactor via an insulating member, an insulator 120, and is vacuum-sealed with vacuum seals 121 and 122. In the reactor 100, a shield 123 is provided so that a coaxial structure having the electrode 102 as a center conductor can be made up and also the electrode 102 can be connected to a matching box (not shown) on the upper side as viewed in the drawing. On the vacuum side of the insulator 120, an insulator 124 is provided which is formed of the porous ceramic material. A deposition shielding plate 125 and an electrode cover 126 in the reactor are also constituted of the porous ceramic material.

As stated above, in the present invention, the porous ceramic material may be used as a deposition shielding plate and besides may be used as a functional component part such as an insulator. In particular, the insulator is considered preferably to have a concavely complicated shape as shown in FIG. 5, in order to prevent any abnormal discharge at the time the glow discharge is started or to prevent plasma from going around through a gap formed between the electrode cover and the insulator. Hitherto, for those having such a shape, it has not been easy to be blast-finished uniformly over the concaved surfaces. However, according to the present invention, a uniform surface roughness can be attained over every surface even when the insulator has such a complicated shape, and hence the film come-off can be prevented greatly effectively.

An example of the procedure to form deposited films by using the deposited film forming apparatus of the present invention will be described below as an instance where the apparatus shown in FIGS. 4A and 4B and FIG. 5. is used.

First, cylindrical substrates 101 having been degreased and cleaned are set in the reactor 100, and the inside of the reactor is evacuated by means of an exhaust device (e.g., a vacuum pump). Subsequently, the temperature of each cylindrical substrate 101 is controlled to the desired temperature of from 200° C. to 500° C. by means of the heater 104 while rotating the cylindrical substrates 101.

At the time each cylindrical substrate 101 has had a desired temperature, material gases are fed into an internal chamber 103 from the gas feed system (not shown) through the gas feed pipe 111. Here, care should be taken so as not to cause any extreme pressure variations such as violent gas flow. Next, at the time the materials gases have come to flow at predetermined flow rates, an exhaust valve (not shown) is adjusted while watching a vacuum gauge (not shown), to provide the desired inner pressure.

At the time the inner pressure has become stable, the high-frequency power source 107 is set at the desired electric power and a high-frequency power is applied to the high-frequency electrode 102 through the high-frequency power matching box 106 to cause glow discharge to take place. This discharge energy causes decomposition of the material gases fed into the reactor 100, so that predetermined deposited films are formed on the substrates 101. In that course, the substrates are rotated by means of the substrate rotating motors 109 during the formation of deposited films so that the deposited films can be formed over the whole surfaces of the substrates. After films with the desired thickness have been formed, the supply of high-frequency power is stopped and the material gases are stopped from flowing into the reactor. The formation of deposited films is thus completed. When a deposited film having a multi-layer configuration with a plurality of layers is formed on each substrate on account of the intended properties of deposited films, the above operation may be repeated for each layer, whereby deposited films having the desired layer configuration can be obtained.

In the present invention, substrates having any desired shape may be used as the substrate. Cylindrical ones are preferred when used for electrophotographic photosensitive members. As materials therefor, conductive materials or materials whose surfaces have been subjected to conductive treatment are usually used. For example, usable materials are metals such as Al, Cr, Mo, Au, In, Nb, Ni, Te, V, Ti, Pt, Pb and Fe, and besides alloys of any of these, as exemplified by stainless steel. As those for the materials whose surfaces have been subjected to conductive treatment, usable materials are alumina ceramics, aluminum nitride, boron nitride, silicon nitride, silicon carbide, silicon oxide, beryllium oxide, quartz glass and Pyrex glass, and besides synthetic resins such as polycarbonate and Teflon. When the materials whose surfaces have been subjected to conductive treatment are used as substrates, their sides opposite to the sides on which the deposited films are formed may preferably be also subjected to conductive treatment.

As the material gases used in the present invention, when, e.g., amorphous silicon is formed, gaseous or gasifiable silicone hydrates (silanes) such as $SiH_4$ and $Si_2H_6$ may effectively be used as Si-feeding gases. Besides the silicon hydrides, gaseous or gasifiable substances such as silicon compounds containing fluorine atoms, what is called silane derivatives substituted with fluorine atoms, may also be effective as Si-feeding gases used in the present invention, specifically as exemplified by silicon fluorides such as $SiF_4$ and $Si_2F_6$ and fluorine-substituted silicon hydrides such as $SiH_3F$, $SiH_2F_2$ and $SiHF_3$. Also, these Si-feeding material gases may optionally be diluted with a gas such as $H_2$, He, Ar or Ne when used, without causing any difficulty in the present invention.

In addition to the above gases, atoms belonging to Group III of the periodic table or atoms belonging to Group V of the periodic table may also be used as what is called dopants. For example, when boron atom (B) is used as the Group III atom, boron hydrides such as $B_2H_6$ and $B_4H_{10}$ and boron halides such as $BF_3$ and $BCl_3$ may be used. When phosphorus atom (P) is used as the Group V atom, phosphorus hydrides such as $PH_3$ and $P_2H_4$ may be used.

When, e.g., amorphous silicon carbide (a-SiC) is formed, in addition to the above gases, those having C and H as constituent atoms may also be used as gases for feeding carbon atoms, as exemplified by saturated hydrocarbons having 1 to 5 carbon atoms, ethylene-series hydrocarbons having 2 to 4 carbon atoms and acetylene-series hydrocarbons having 2 or 3 carbon atoms. Stated specifically, the saturated hydrocarbons may include methane ($CH_4$) and ethane ($C_2H_6$); the ethylene-series hydrocarbons, ethylene ($C_2H_4$) and propylene ($C_3H_6$); and the acetylene-series hydrocarbons, acetylene ($C_2H_2$) and methylacetylene ($C_3H_4$).

When, e.g., amorphous silicon oxide (a-SiO) is formed, in addition to the above gases, those usable as gases for introducing oxygen atoms may include oxygen ($O_2$), ozone ($O_3$), nitrogen monoxide (NO), nitrogen dioxide ($NO_2$), dinitrogen monoxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and those having a silicon atom (Si), an oxygen atom (O) and a hydrogen atom (H) as constituent atoms as exemplified by lower siloxanes such as disiloxane ($H_3SiOSiH_3$) and trisiloxane ($H_3SiOSiH_2OSiH_3$).

When, e.g., amorphous silicon nitride (a—SiN) is formed in the present invention, in addition to the above gases, those usable as gases for introducing nitrogen atoms may include nitrogen ($N_2$) and gaseous or gasifiable nitrogen compounds such as ammonia ($NH_3$), hydrazine ($H_2NNH_2$) and hydrogen azide. Besides, in view of an advantage that halogen atoms can also be fed in addition to the feeding of nitrogen atoms, they may also include nitrogen halide compounds such as nitrogen trifluoride ($F_3N$) and nitrogen tetrafluoride ($F_4N_2$).

Gas pressure inside the reactor may likewise appropriately be selected within an optimum range depending on the intended properties of deposited films. In usual instances, it may be set within the range of from 0.01 to 1,000 Pa, preferably from 0.03 to 300 Pa, and most preferably from 0.1 to 100 Pa.

EXAMPLES

Experiments and Examples of the present invention will be given below. The present invention is by no means limited by these.

(Experiment 1)

In the apparatus for forming electrophotographic photosensitive members which is shown in FIGS. 4A and 4B and FIG. 5, electrode covers prepared using porous ceramic materials having different apparent porosity were set, and electrophotographic photosensitive members were produced according to the foregoing procedure under conditions shown in Table 1. In the present Experiment, all samples were made of alumina ceramics. Component parts other than the electrode cover, the insulator and the deposition shielding plate, were prepared using porous ceramic materials having an average pore diameter of 3 μm and a porosity of 30%. On the electrophotographic photosensitive members thus produced, their surfaces were observed to evaluate the number of spherical protuberances having a diameter of 5 μm or larger. To make the evaluation on spherical protuberances, nine arbitrary spots on each electrophotographic photosensitive member obtained were picked up and the number of spherical protuberances present in the region of 1 $cm^2$ was examined for each spot. Evaluation was made according to their total number at nine spots.

Results obtained are shown in Table 2. In Table 2, the number of spherical protuberances is shown as data of relative evaluation made by regarding as 1 the value obtained when a sample having an average pore diameter of 3 μm and an apparent porosity of 30%, showing the best results, was used.

TABLE 1

| Layer configuration: | Charge injection blocking layer | Photo-conductive layer | Surface layer |
|---|---|---|---|
| Material gas flow rate: | | | |
| $SiH_4$ (sccm) | 250 | 250 | 150 |
| $H_2$ (sccm) | 500 | 500 | — |
| $B_2H_6$ (ppm) (based on $SiH_4$) | 2,000 | — | — |
| $CH_4$ (sccm) | 400 | — | 500 |
| Substrate temperature: (° C.) | 300 | 280 | 300 |
| Internal pressure: (Pa) | 2 | 2 | 2 |
| High-frequency power (W) (105 MHz) | 1,000 | 2,000 | 500 |
| Layer thickness:* (μm) | 3 | 30 | 0.5 |

*Layer thickness is an approximate standard value in the designing of electrophotographic light-receiving members.

TABLE 2

| Average pore diameter ($\mu$m) | Apparent porosity (%) | | | | | | |
|---|---|---|---|---|---|---|---|
| | 5 | 10 | 20 | 30 | 35 | 39 | 45 |
| 200 | 3.8 | 2.9 | 3.1 | 3.9 | 3.2 | 3.8 | 9.8 |
| 150 | 2.3 | 1.4 | 1.3 | 1.3 | 1.2 | 1.6 | 5.3 |
| 100 | 2.3 | 1.2 | 1.1 | 1.1 | 1.1 | 1.4 | 5.1 |
| 20 | 2.2 | 1.4 | 1.0 | 1.1 | 1.2 | 1.4 | 4.3 |
| 3 | 2.3 | 1.2 | 1.0 | 1.0 | 1.1 | 1.5 | 6.9 |
| 2 | 1.9 | 1.3 | 1.1 | 1.2 | 1.0 | 1.4 | 5.1 |
| 1 | 2.1 | 1.3 | 1.4 | 1.3 | 1.1 | 1.4 | 2.6 |
| 0.5 | 1.9 | 1.9 | 2.1 | 2.1 | 1.9 | 2.3 | 4.8 |

(Comparative Experiment 1)

An electrode cover was prepared which was made of an alumina ceramic having no pores and was surface-roughened by blast finishing. An electrophotographic photosensitive member was produced in the same manner as in Experiment 1, and spherical protuberances were examined to make evaluation similarly. As the result, the number of spherical protuberances was 1.9.

As can be seen from the above Table 2 and the results of Comparative Experiment 1, good results are obtained when the average pore diameter and the apparent porosity are within the ranges of from 1 $\mu$m to 150 $\mu$m and from 10% to 39%, respectively. Also, very good results are obtained when the average pore diameter and the apparent porosity are within the ranges of from 2 $\mu$m to 100 $\mu$m and from 20% to 35%, respectively.

With regard to the sample of the porous ceramic material having an average pore diameter of 2 $\mu$m and an apparent porosity of 20% as used in Experiment 1 and the sample having no pores as used in Comparative Experiment 1, the surface roughness at 20 spots picked up arbitrarily on each sample (ten-point mean roughness measured on a standard length of 2.5 mm: Rz) was measured to examine its scattering. As the results, in the porous ceramic material, the minimum value was 28.9 $\mu$m and the maximum value was 34.3 $\mu$m, whereas, in the ceramic material having no pores, the minimum value was 13.9 $\mu$m and the maximum value was 59.3 $\mu$m. This scattering is considered to be one of the causes of making the spherical protuberances worse.

(Experiment 2)

In the apparatus for forming electrophotographic photosensitive members which is shown in FIGS. 4A and 4B and FIG. 5, samples each made of a porous ceramic material comprising an alumina ceramic and having a diameter of 26 mm, a length of 30 mm and a thickness of 3 mm were set. The samples had average pore diameter and apparent porosity as shown in Table 3.

After these samples were set in the apparatus for forming electrophotographic photosensitive members, electrophotographic photosensitive members were formed under the conditions shown in Table 1, and the process shown in Table 4 was carried out to make regeneration treatment. To move the samples from one step to the next, like other component parts used simultaneously, the samples were put in a basket made of stainless steel and transported using a hand truck.

TABLE 3

| Sample | Average pore diameter ($\mu$m) | Apparent porosity (%) |
|---|---|---|
| Sample A | 5 | 5 |
| Sample B | 5 | 10 |
| Sample C | 5 | 20 |
| Sample D | 5 | 30 |

TABLE 3-continued

| Sample | Average pore diameter ($\mu$m) | Apparent porosity (%) |
|---|---|---|
| Sample E | 5 | 35 |
| Sample F | 5 | 39 |
| Sample G | 5 | 45 |

TABLE 4

| Process: Formation of photosensitive member | Dry etching | Washing with water | Drying |
|---|---|---|---|
| Conditions: | | | |
| Table 1 | ClF$_3$: 250 sccm<br>N$_2$: 5,000 sccm<br>Pressure: 5 kPa | Pure water in 50 L container was flowed at 5 L/min. | Dryer temp.: 150° C. |
| Time: | | | |
| Table 1 | 90 min. | 120 min. | 120 min. |

This cycle was repeated 50 times. The initial weight and the surface roughness (ten-point mean roughness measured on a standard length of 2.5 mm: Rz) were measured for each sample, and measurements were each compared with values obtained after 50 cycles were completed. With regard to the surface roughness, samples were previously provided with markings in the regions of 1 cm$^2$ in order to prevent its scattering due to measuring positions, and the Rz was measured ten times in that regions to compare average values.

(Comparative Experiment 2)

In the same size as that of the samples used in Experiment 2, a sample surface-roughened by blast finishing to have a surface roughness of about 30 $\mu$m was prepared using an alumina ceramic having no pores. This sample was designated as Sample H, and the cycle process was repeated 50 times in the same manner as that for the samples of Experiment 2 to compare the weight and surface roughness at the initial stage and the weight and surface roughness after 50 cycles. With regard to the surface roughness, the sample was previously provided with markings in the regions of 1 cm$^2$ in order to prevent its scattering due to measuring positions, and the Rz was measured ten times in that regions to compare average values.

Results obtained in the above Experiment 2 and Comparative Experiment 2 are shown in Table 5.

TABLE 5

| Sample | Change in weight (%) | Surface roughness (Rz) | |
|---|---|---|---|
| | | Initial stage ($\mu$m) | After 50 cycles ($\mu$m) |
| Sample A | 96.4 | 24.6 | 26.9 |
| Sample B | 97.1 | 30.5 | 31.6 |
| Sample C | 96.1 | 33.1 | 33.4 |
| Sample D | 97.3 | 34.8 | 38.1 |
| Sample E | 95.4 | 32.9 | 29.3 |
| Sample F | 94.1 | 29.4 | 32.4 |
| Sample G | 78.6 | 31.8 | 39.3 |
| Sample H | 98.7 | 31.8 | 12.9 |

In Table 5, the change in weight is indicated as a percentage of the proportion of the weight after 50 cycles to the weight at the initial stage. As can be seen from the results shown in Table 5, the change in weight abruptly increases when the apparent porosity (Table 3) is higher than 39% (Sample G). This is presumed to be due to not only an increase in the degree of abrasion because of a remarkable tendency of an abrupt decrease in mechanical strength but also the coming-off of ceramic materials because of a stress of deposited films during the formation of photosensitive members. Because of the effect of these, the surface roughness after 50 cycles resulted in a greater surface roughness than that of the initial stage. Samples A to F are all within the range not problematic in practical use in respect of the change in weight, and also within the range of scattering in respect of the change in surface roughness. It, however, can be seen that Sample H, a ceramic material having no pores, has attained the smallest value in respect of the change in weight but has decreased by half or less in respect of the surface roughness. This is considered due to the fact that the surface roughness formed by blast finishing has been lost as a result of wear.

(Example 1)

Using the apparatus of the present invention for forming electrophotographic photosensitive members which is shown in FIGS. 4A and 4B and FIG. 5, electrophotographic photosensitive members were produced under conditions shown in Table 6.

TABLE 6

| Layer configuration: | Charge injection blocking layer | Photo-conductive layer | Surface layer |
| --- | --- | --- | --- |
| Material gas flow rate: | | | |
| SiH$_4$ (sccm) | 250 | 550 | 120 |
| H$_2$ (sccm) | 500 | 1,000 | — |
| B$_2$H$_6$ (ppm) (based on SiH$_4$) | 1,000 | 2 | — |
| CH$_4$ (sccm) | 150 | — | 500 |
| Substrate temperature: (° C.) | 250 | 250 | 250 |
| Internal pressure: (Pa) | 6 | 4 | 4 |
| High-frequency power (W) (105 MHz) | 3,000 | 5,000 | 800 |
| Layer thickness:* ($\mu$m) | 3 | 30 | 0.5 |

*Layer thickness is an approximate standard value in the designing of electrophotographic light-receiving members.

In the present Example, the deposition shielding plate, insulator and electrode cover shown in FIG. 5 were formed of porous ceramic materials, using alumina ceramics as materials. These materials had an average pore diameter of 2 $\mu$m, an apparent porosity of 28% and a surface roughness (Rz) of 31.3 $\mu$m. On the electrophotographic photosensitive members thus produced, evaluation was made in respect of melt-adhesion of toner and white dots in the following way.

Melt-adhesion:

Each electrophotographic photosensitive member was set in an electrophotographic apparatus (NP6060, manufactured by CANON INC., remodeled for the present test). An image chart available from CANON INC. (parts number: FY9-9060) was set on the original glass plate, and image formation was repeated on 250,000 sheets. Thereafter, the photosensitive member was taken out to observe the photosensitive member surface and the images obtained.

On the melt-adhesion, evaluation was made according to the following four ranks:

AA: No melt-adhesion is seen.
A: Melt-adhesion is seen on the photosensitive member surface but not perceivable as defects on images.
B: Defects on images are perceivable as defects on images, but not problematic in practical use.
C: Defects on images are perceivable, and not feasible for practical use in some cases.

White dots:

Each electrophotographic photosensitive member was set in an electrophotographic apparatus (NP6060, manufactured by CANON INC., remodeled for the present test) and imagewise exposure was shut off to prepare an initial whole-area black image (solid black image). Then, an image chart available from CANON INC. (parts number: FY9-9060) was set on the original glass plate, and image formation was repeated on 3,000,000 sheets. Thereafter, the solid black image was again reproduced to evaluate the number of white dots together with an initial image.

On the white dots, evaluation was made according to the following four ranks:

AA: Very good (no white dots).
A: Good.
B: No problem in practical use.
C: Defects on images are perceivable, and not feasible for practical use in some cases.

(Example 2)

Using the apparatus of the present invention for forming electrophotographic photosensitive members which is shown in FIGS. 4A and 4B and FIG. 5, electrophotographic photosensitive members were produced under conditions shown in Table 6.

In the present Example, the deposition shielding plate, insulator and electrode cover shown in FIG. 5 were formed of porous ceramic materials, using boron nitride as materials. These materials had an average pore diameter of 15 $\mu$m, an apparent porosity of 20% and a surface roughness (Rz) of 22.6 $\mu$m. On the electrophotographic photosensitive members thus produced, evaluation was made in respect of melt-adhesion of toner and white dots in the same manner as in Example 1.

(Example 3)

Using the apparatus of the present invention for forming electrophotographic photosensitive members which is shown in FIGS. 4A and 4B and FIG. 5, electrophotographic photosensitive members were produced under conditions shown in Table 6.

In the present Example, the deposition shielding plate, insulator and electrode cover shown in FIG. 5 were formed of porous ceramic materials, using titanium dioxide as materials. These materials had an average pore diameter of 15 $\mu$m, an apparent porosity of 20% and a surface roughness (Rz) of 22.6 $\mu$m. On the electrophotographic photosensitive members thus produced, evaluation was made in respect of melt-adhesion of toner and white dots in the same manner as in Example 1.

(Comparative Example 1)

Using the apparatus of the present invention for forming electrophotographic photosensitive members which is shown in FIGS. 4A and 4B and FIG. 5, electrophotographic photosensitive members were produced under conditions shown in Table 6.

In the present Comparative Example, the deposition shielding plate, insulator and electrode cover shown in FIG. 5 were formed of alumina ceramics having no pores and surface-roughened by blast finishing. These had a surface roughness (Rz) of 48.3 $\mu$m. On the electrophotographic photosensitive members thus produced, evaluation was made in respect of melt-adhesion of toner and white dots in the same manner as in Example 1.

Results obtained in the above Examples 1 to 3 and Comparative Example 1 are shown together in Table 7.

TABLE 7

|  | Example | | | Comparative |
|---|---|---|---|---|
|  | 1 | 2 | 3 | Example 1 |
| Melt-adhesion: | AA | AA | AA | A |
| White dots: | AA | AA | AA | A |

As can be seen from Table 7, in the apparatus of the present invention for forming electrophotographic photosensitive members, very good results were obtained in all Examples. In the above Examples and Comparative Example, the values of surface roughness are indicated as average values obtained by measuring Rz at arbitrary ten points of the respective members.

As described above, in the present invention, at least part of the inner wall surfaces of the reactor or surfaces of structural component parts on which films are deposited is constituted of the porous ceramic material that strengthen the adhesion of deposited films. Thus, it becomes possible to ensure a uniform and good surface roughness without relying on any mechanical surface-roughening means such as blast: finishing, thus a deposited film forming apparatus and process can be realized which can prevent effectively the deposited films from coming off, can restrain the spherical protuberances from occurring and can form electrophotographic photosensitive members having a superior quality. In addition, since the porous ceramic material is used, it can be used widely in the reactor while utilizing its properties such as heat resistance and corrosion resistance.

What is claimed is:

1. A deposited film forming apparatus comprising:
   a means for introducing at least high-frequency power to the inside of a reactor;
   a means for feeding a material gas into the reactor; and
   a substrate supporting means for supporting a substrate on which a deposited film is to be formed, the deposited film being formed on the substrate by applying the high-frequency power thereon to cause glow discharge to take place to decompose the material gas;
   wherein at least part of the inner wall surfaces of the reactor or surfaces of structural component parts on which films are deposited is constituted of a porous ceramic material, the porosity of which extends throughout the ceramic material; and
   wherein the porous ceramic material has an average pore diameter of from 1 $\mu$m to 150 $\mu$m and an apparent porosity of from 10% to 39%.

2. The deposited film forming apparatus according to claim 1, wherein the porous ceramic material has an average pore diameter of from 2 $\mu$m to 100 $\mu$m and an apparent porosity of from 20% to 35%.

3. The deposited film forming apparatus according to claim 1, wherein the porous ceramic material comprises an alumina ceramic.

4. The deposited film forming apparatus according to claim 1, wherein the porous ceramic material comprises boron nitride.

5. The deposited film forming apparatus according to claim 1, wherein the porous ceramic material comprises titanium dioxide.

6. The deposited film forming apparatus according to claim 1, wherein the porous ceramic material is used as an insulating member provided between an electrode of the means for introducing high-frequency power and the reactor.

7. The deposited film forming apparatus according to claim 6, wherein the insulating member is an insulator.

8. The deposited film forming apparatus according to claim 1, wherein the porous ceramic material is provided around an electrode of the means for introducing high-frequency power.

9. The deposited film forming apparatus according to claim 1, wherein the porous ceramic material is used as a deposition shielding plate provided on the inner wall of the reactor.

10. The deposited film forming apparatus according to claim 1, wherein the porous ceramic material has pores which are distributed substantially uniformly and are three-dimensionally interconnected.

* * * * *